United States Patent [19]

Ganesan et al.

[11] Patent Number: 4,573,099

[45] Date of Patent: Feb. 25, 1986

[54] CMOS CIRCUIT OVERVOLTAGE PROTECTION

[75] Inventors: Apparajan Ganesan; Ronald A. Morrison, both of Indianapolis, Ind.

[73] Assignee: AT&T Bell Laboratories, Murray Hill, N.J.

[21] Appl. No.: 626,230

[22] Filed: Jun. 29, 1984

[51] Int. Cl.$^4$ ............................................. H02H 9/04
[52] U.S. Cl. ................................. 361/56; 361/18; 361/91
[58] Field of Search .................. 361/56, 91; 307/542, 307/546, 547, 548; 318/18

[56] References Cited

U.S. PATENT DOCUMENTS

| | | | |
|---|---|---|---|
| 3,395,290 | 10/1965 | Farina | 361/91 |
| 3,558,979 | 1/1971 | Lorenz | 361/56 |
| 3,594,612 | 7/1971 | Gately | 361/91 |
| 3,793,535 | 2/1974 | Chowdhurl | 307/202 |
| 3,823,353 | 7/1974 | Berger et al. | 307/459 |
| 3,934,175 | 1/1976 | Clark | 317/16 |
| 4,445,160 | 4/1984 | Gordon | 361/91 |

*Primary Examiner*—Harry E. Moose, Jr.

*Attorney, Agent, or Firm*—Volker R. Ulbrich

[57] ABSTRACT

A CMOS circuit (10) for preventing overvoltage between two supply nodes (12,14) makes use of vertical NPN bipolar transistors (80,84) for their current-carrying capability. Zener diodes (16,18,20,22) and a resistor (24) generate a sensing voltage which is amplified by a vertical bipolar transistor (28) and coupled to one input of a comparator (40) which has the other input at a bias voltage node (52) of a voltage divider (54,56,58,60). The comparator output (50) is coupled to the input of a transimpedance transistor (72) which drives the input current of a current mirror (66,74). The output (78) of the current mirror turns on the current-carrying transistors (80,84). Positive feedback for latching is provided by connecting the common gates of the current mirror transistors to the gate of a feedback transistor (86) which has its current path connected between the one supply node and the base (26) of the first bipolar transistor. The vertical bipolar transistors (28,80,84) of the circuit include guard rings (37) of heavily doped material about the emitter (32) and base (34) regions at the surface and tied to the collector voltage.

13 Claims, 2 Drawing Figures

CMOS CIRCUIT OVERVOLTAGE PROTECTION

TECHNICAL FIELD

The invention relates generally to overvoltage surge protection of electronic circuits, and relates more particularly to such protection for complementary metal-oxide-semiconductor (CMOS) circuits.

BACKGROUND OF THE INVENTION

Electronic circuits which are connected to a large network, such as an electrical power or a telecommunications network need protection from overvoltage conditions to which they may be subjected as a result of lightning strokes, switching surges or other events which typically result in overvoltage surge propagation in such networks. What may be adequate protection for one type of electronic circuit may be entirely inadequate for another one with elements more susceptible to this sort of damage.

Circuits which are realized in CMOS technology are particularly susceptible to damage by overvoltages and are at the same time difficult to protect from them. Bipolar device circuits can be protected by a a zener diode in conjunction with a silicon controlled rectifier (SCR) latch. The latch is formed by an NPN and a PNP transistor and appropriate resistors which are connected between their collectors and a positive voltage supply node. When such transistors are formed in a CMOS integrated circuit (IC), however, their collectors are necessarily tied directly to the positive voltage supply node and are therefore not accessible for the connection of resistors. On the other hand, the MOS devices, which could be readily formed in the circuit, are not suited for carrying the currents involved in that function

SUMMARY OF THE INVENTION

The novel circuit in accordance with the present invention uses vertical bipolar transistors to carry the overvoltage surge current. The transistors are controlled by a voltage sensing and driving arrangement which inclues means for latching the current-carrying bipolar transistors in their conducting state for the course of the surge. The structure of the vertical bipolar transistors is such that it can be readily incorporated in a CMOS integrated circuit. The lower transconductance transistors of the sensing, latching, and driving circuits for them can then be conveniently in the form of MOS devices and thereby can be provided with better accuracy and in a reduced circuit area.

DETAILED DESCRIPTION

Figure 1:
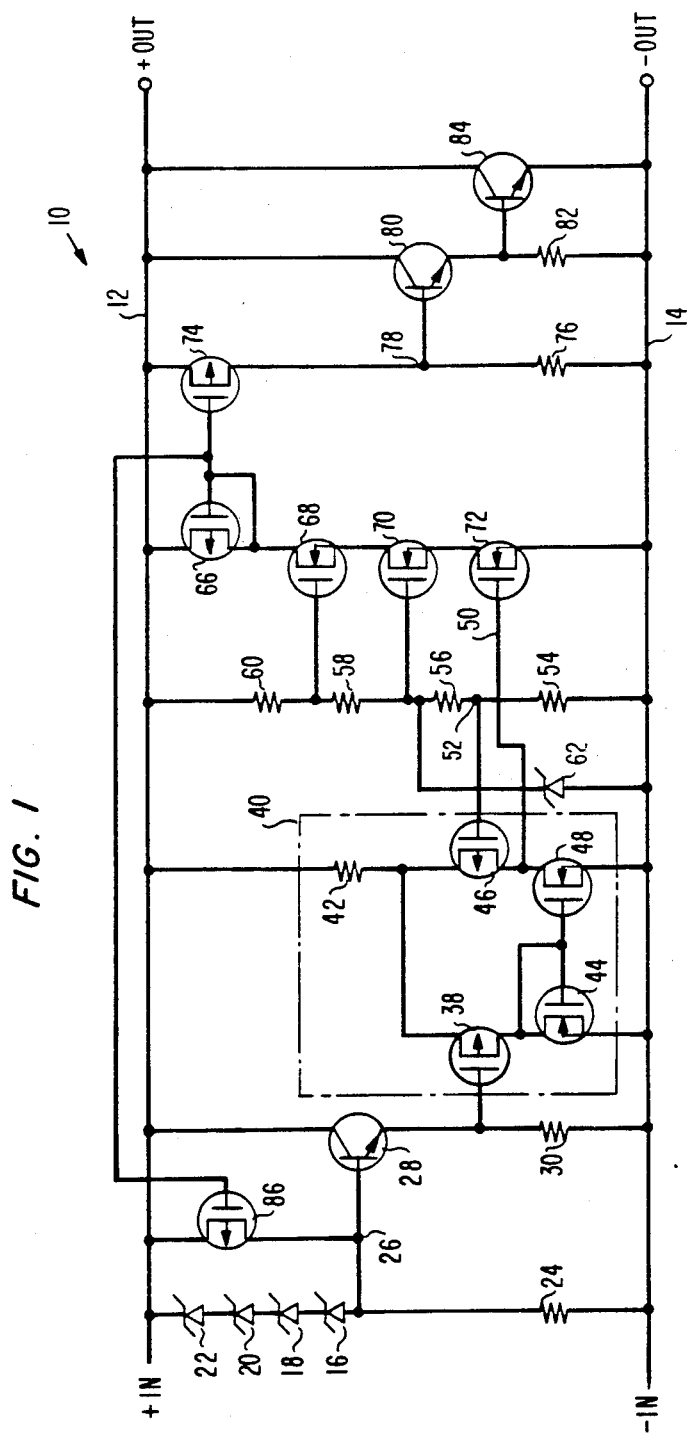
FIG. 1 is a schematic circuit diagram of one example of a CMOS overvoltage surge protection circuit in accordance with the present invention and suitable for integration in a CMOS circuit to be protected.

The circuit 10 of FIG. 1 is designed to provide overvoltage protection between a positive supply voltage rail 12 and a negative supply voltage rail 14. A stack of four zener diodes 16, 18, 20, 22 is connected in series with a voltage sensing resistor 24 between the rails 12, 14 to provide a triggering voltage at the common node 26 when the diodes 16, 18, 20, 22 break down under an overvoltage. The node 26 is connected to the base of a bipolar transconductance transistor 28 which has its collector connected to the positive rail 12 and its emitter connected through a current sensing resistor 30 to the negative rail 14.

Figure 2:
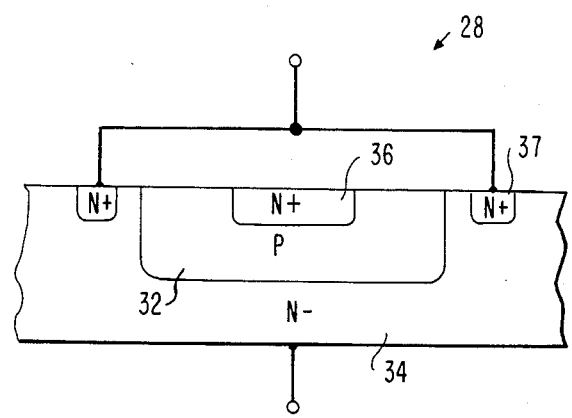
FIG. 2 is a schematic sectional view of a vertical bipolar transistor of the circuit of FIG. 1 for carrying relatively large currents.

The transconductance transistor 28 is a vertical bipolar structure shown in greater detail in FIG. 2. It includes a P-type base region 32 diffused in an N-type substrate 34. Inside the base region 32 there is diffused an N-type emitter 36. The base 32 and the emitter 36 are surrounded at the surface by a guard ring 37 of highly-doped N-type material which is tied to the same voltage as is the substrate 34. The substrate 34 acts as the collector, and is therefore at the voltage of the positive rail 12. The guard ring 37 provides improved contact to the substrate 34.

Returning now to FIG. 1, the emitter of the bipolar transistor 28 is connected to the gate of a P-channel enhancement mode MOS input transistor 38 of a comparator 40. The comparator 40 includes a resistor 42 connected between the positive rail 12 and the source of the transistor 38. The drain of the transistor 38 is connected to the drain of an N-channel enhancement mode MOS current mirror transistor 44 which has its source connected to the negative rail 14. A second P-channel enhancement mode MOS input transistor 46 has its source connected to the resistor 42 and its drain connected to the drain of a second N-channel enhancement mode MOS current mirror transistor 48 which has its source connected to the negative rail 14. The gates of the current mirror transistors 44, 48 are both tied to the drain of the transistor 44. The comparator input transistors 38, 46 are designed with different channel length-to-wide ratios so that there is a built-in voltage offset in the comparator 40 to prevent its output voltage at the node 50 from moving in the wrong direction.

The gate of the second comparator input transistor 46 is tied to a bias voltage point 52 within a voltage divider stack made up of a four resistors 54, 56, 58, and 60 connected in series between the rails 12, 14. A zener diode 62 connected between the negative rail 14 and the common node of the resistors 56, 58 serves to limit the bias voltage at the node 52.

A P-channel enhancement mode MOS current mirror input transistor 66, which has its source connected to the positive rail 12 has its current path connected in series with three N-channel enhancement mode MOS transistors 68, 70, 72 to the negative rail 14. The gate of the transistor 68 is tied to the common node of the resistors 58, 60; the gate of the transistor 70 is tied to the common node of the resistors 56, 58; and, the gate of the transistor 72 is connected to the output node 50 of the comparator 40. The transistor 72 controls the current in the current mirror input transistor 66 in response to the output of the comparator 40. The transistors 68, 70, 72 are arranged in a cascode manner and prevent excessive voltage between the source and drain of the transistor 72.

A P-channel enhancement mode MOS current mirror output transistor 74 has its source connected to the positive rail 12 and its drain connected through a resistor 76 to the negative rail 14. The gates of the current mirror transistors 66, 74 are connected to the drain of the current mirror imput transistor 66. The output of the current mirror at node 78 is connected to the base of a vertical bipolar NPN transistor 80 which has its collector connected to the positive rail 12 and its emitter connected through a resistor 82 to the negative rail 14. Another vertical bipolar NPN transistor 84, with its collector connected to the positive rail 12 and its emitter connected directly to the negative rail 14, has its base tied to the emitter of the transistor 80. The first transistor 80 provides the driving current for the second, shunting transistor 84, which carries a higher current in its conduction path.

A P-channel enhancement mode MOS transistor 86 having its source connected to the positive rail 12, its drain connected to the triggering voltage node 26, and its gate connected to the common gates of the current mirror transistors 66, 74 acts as a positive feedback element to hold the circuit 10 in its latched condition during an overvoltage.

In the operation of the circuit 10, the zener diodes 16, 18, 20, 22 are chosen so that they break down at the desired overvoltage threshold. This causes a sudden rise in the voltage at the node 26. This voltage rise is buffered by the transistor 28 and used to cause the comparator to change states. When it does so, its output turns on the transistor 72 to initiate current in the current mirror input transistor 66 and in the output transistor 74. The output of the current mirror transistor 74 then turns on the bipolar transistor 80. The output of this transistor 80 then turns on the bipolar transistor 84 to provide a direct shunt through it between the rails 12, 14. The comparator 40 is held in its changed state by the action of the feedback transistor 86, which keeps the trigger voltage node 26 high by reference to the common gates of the current mirror transistors 66, 74.

While the novel circuit has particular benefits for CMOS circuit protection because it can be realized in a form suitable for integration in such a circuit, it may also be realized in entirely bipolar form in ways which will be readily apparent to those skilled in the art by appropriately replacing the MOS devices with bipolar ones. In that case, the bipolar transistors for carrying the current between the supply nodes need not be vertical structures, but may instead be NPN or PNP structures of the ordinary variety use for such functions in bipolar circuits.

It is understood that a circuit in accordance with the invention may be realized with either N-well or P-well technology devices. This means, of course, that the bipolar devices also will have their region polarities determined accordingly.

The number of zener diodes needed for providing the triggering threshold depends upon the intended function of the circuit and can be any desired number as appropriate. Likewise, the number of transistors connected between the current mirror input transistor and the supply node, as the transistors 68, 70 of the circuit 10, will depend upon the overvoltage threshold and the voltage that the transistor which controls to current mirror input branch current can withstand between its source and drain without damage.

The invention is not limited to a particular configuration for turning on the bipolar transistors which provide the current shunting between the rails 12, 14, but rather resides in the use of vertical bipolar NPN or PNP devices for this current shunting. It is this feature which makes it feasible to integrate the circuit within a larger CMOS circuit. n9

What is claimed is:

1. Apparatus for protecting an electronic circuit from an overvoltage surge between positive and a negative supply voltage nodes, comprising:
   a first vertical bipolar transistor having its emitter-collector path connected between the supply nodes;
   a second vertical bipolar transistor having its emitter-collector path connected between one of the supply nodes and the base of the first vertical bipolar transistor;
   a first resistor connected between the base of the first bipolar transistor and the other supply node, and
   switching means responsive to an overvoltage condition between the supply nodes connected to the base of the second bipolar transistors for turning on the first and second bipolar transistors for the course of the overvoltage condition, the switching means including a latch circuit and a voltage sensing means which generates an activating voltage in response to an overvoltage, and
   a comparator having two input nodes, one of the input nodes being coupled to the activating voltage and the other input node being coupled to the input of a bias voltage node.

2. The apparatus as defined in claim 1 comprising current amplifying means having an input connected to an output node of the comparator and having an output connected to the base of the second bipolar transistor, and further comprising positive feedback means connected between the current amplifying means and the sensing means for latching the first and second bipolar transistors in their conducting condition during the overvoltage condition.

3. The apparatus as defined in claim 2 wherein the voltage sensing means includes a voltage buffer.

4. The apparatus as defined in claim 3 wherein the sensing means includes a zener diode connected in series with a first, sensing resistor between the supply nodes.

5. The apparatus as defined in claim 4 wherein the voltage buffer comprises a transconductance transistor having its conduction path connected between one supply node and one input of the comparator and a second resistor connected between the other supply node and the one input of the comparator.

6. The apparatus as defined in claim 5 wherein the transconductance transistor is a third vertical bipolar transistor having the second resistor connected between one side of its emitter-collector path and the other supply node.

7. The apparatus as defined in claim 6 wherein the current amplifying means includes first and second current mirror transistors having one side of their conduction paths connected to one of the supply nodes and having their control electrodes connected together.

8. The apparatus as defined in claim 7 wherein the positive feedback means comprises a feedback transistor having its current path connected between one of the supply nodes and the common node of the zener diode and the first, sensing resistor and having its control electrode connected to the control electrodes of the current mirror transistors.

9. The apparatus as defined in claim 8 comprising control means having an input connected to the other input of the comparator and having an output connected to the other side of the conduction path of one of the current mirror input transistors.

10. The apparatus as defined in claim 9 wherein the control means comprises at least two field effect transimpedance transistors having their conduction paths connected in series between the other side of the conduction path of the current mirror input transistor and the other supply node, the control electrode of one of the field effect transistors being coupled to the other input of the comparator.

11. The apparatus as defined in claim 10 comprising a plurality of resistors connected in series between the supply nodes to form a voltage divider, the contol electrodes of the other transimpedance transistors being connected to appropriate bias voltage nodes between the resistors of the voltage divider.

12. The apparatus as defined in claim 11 comprising a zener diode connected between one of the other transimpedance transistors and the other supply node.

13. The apparatus as defined in claim 12 wherein the feedback transistor, the current mirror transistors, and any transistors of the comparator are field effect transistors.

* * * * *